US007492599B1

(12) United States Patent
Yu et al.

(10) Patent No.: US 7,492,599 B1

(45) Date of Patent: Feb. 17, 2009

(54) HEAT SINK FOR LED LAMP

(75) Inventors: Guang Yu, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/870,116

(22) Filed: Oct. 10, 2007

(30) Foreign Application Priority Data

Aug. 17, 2007 (CN) ........................ 2007 1 0076401

(51) Int. Cl.

| | |
|---|---|
| ***H05K 7/20*** | (2006.01) |
| ***F21V 29/00*** | (2006.01) |
| ***F28F 7/00*** | (2006.01) |
| ***H01L 23/34*** | (2006.01) |

(52) U.S. Cl. ....................... 361/719; 362/218; 362/294; 362/373; 257/722; 165/80.2; 165/80.3; 165/185; 361/703; 361/704; 361/690

(58) Field of Classification Search ................. 361/703; 362/373

See application file for complete search history.

(56) References Cited

U.S. PATENT DOCUMENTS

| | | | | |
|---|---|---|---|---|
| 4,729,076 | A * | 3/1988 | Masami et al. | 362/235 |
| 5,894,882 | A * | 4/1999 | Kikuchi et al. | 165/80.3 |
| 6,045,240 | A * | 4/2000 | Hochstein | 362/294 |
| 6,397,931 | B1 * | 6/2002 | Lin et al. | 165/80.3 |
| 6,615,910 | B1 * | 9/2003 | Joshi et al. | 165/80.3 |
| 6,748,656 | B2 | 6/2004 | Woerner et al. | |
| 6,749,009 | B2 | 6/2004 | Barten | |
| 6,920,046 | B2 * | 7/2005 | Spryshak | 361/704 |
| 7,284,882 | B2 * | 10/2007 | Burkholder | 362/294 |
| 2007/0057361 | A1 * | 3/2007 | Lange et al. | 257/696 |

* cited by examiner

*Primary Examiner*—Gregory D Thompson

(57) ABSTRACT

A heat dissipation device (40) is used for dissipating heat generated by a plurality of LEDs (15) mounted on a circuit board (12). The heat dissipation device comprises two heat sinks (30) mounted on the circuit board via a heat spreader (20). Each of the two heat sinks comprises a plurality of fins (300) stacked together. A plurality of short walls (350) are formed at two opposite lateral sides of the two heat sinks. A plurality of openings (330) are defined below the short walls and opened laterally. A plurality of vertical cavities (360) are defined by the two heat sinks and communicate with the openings (330), respectively. The cavities in the two heat sinks are alternately arranged.

17 Claims, 3 Drawing Sheets

HEAT SINK FOR LED LAMP

BACKGROUND OF THE INVENTION

1. Field of the Invention

The present invention relates generally to a heat sink, and more particularly to a heat sink used for an LED lamp.

2. Description of Related Art

With the continuing development of scientific technology and the raise of people's consciousness of energy saving, LEDs have been widely used in the field of illumination due to their small size and high efficiency. It is well known that an LED lamp with LEDs arranged side-by-side in large density generates a lot of heat when it emits light. If the heat cannot be quickly removed, the LED lamp may become overheated, significantly reducing work efficiency and service life thereof.

A conventional heat sink which is used to absorb heat of the LED device is shown in U.S. Pat. No. 6,517,218. The heat of the LED device is transferred to a base of a heat dissipater at first, and then is dissipated to ambient air in a natural convection manner by fins of the heat dissipater. However, it is difficult to dissipate a large amount of heat accumulating in a bottom portion between the base and the fins, because airflow can not substantially flow through the bottom portion in the natural convection manner. Moreover, the conventional heat sink always has a great size in order to achieve a large amount of heat dissipation area.

What is needed, therefore, is a heat sink used in an LED device which has an improved heat dissipation efficiency.

SUMMARY OF THE INVENTION

A heat dissipation device is used for dissipating heat generated by a plurality of LEDs mounted on a circuit board. The heat dissipation device comprises two heat sinks mounted on the circuit board via a heat spreader, whereby heat generated by the LEDs is received by the heat sinks via the heat spreader. Each of the two heat sinks comprises a plurality of fins stacked together. A plurality of short walls are formed at two opposite lateral sides of the two heat sinks. A plurality of openings adjacent to bottoms of the two heat sinks are formed between the short walls and the bottoms of the two heat sinks. A plurality of cavities are vertically defined in the two heat sinks and communicate with the openings, respectively, whereby an airflow can flow into the cavities via the openings. The cavities in the two heat sinks are alternately arranged.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
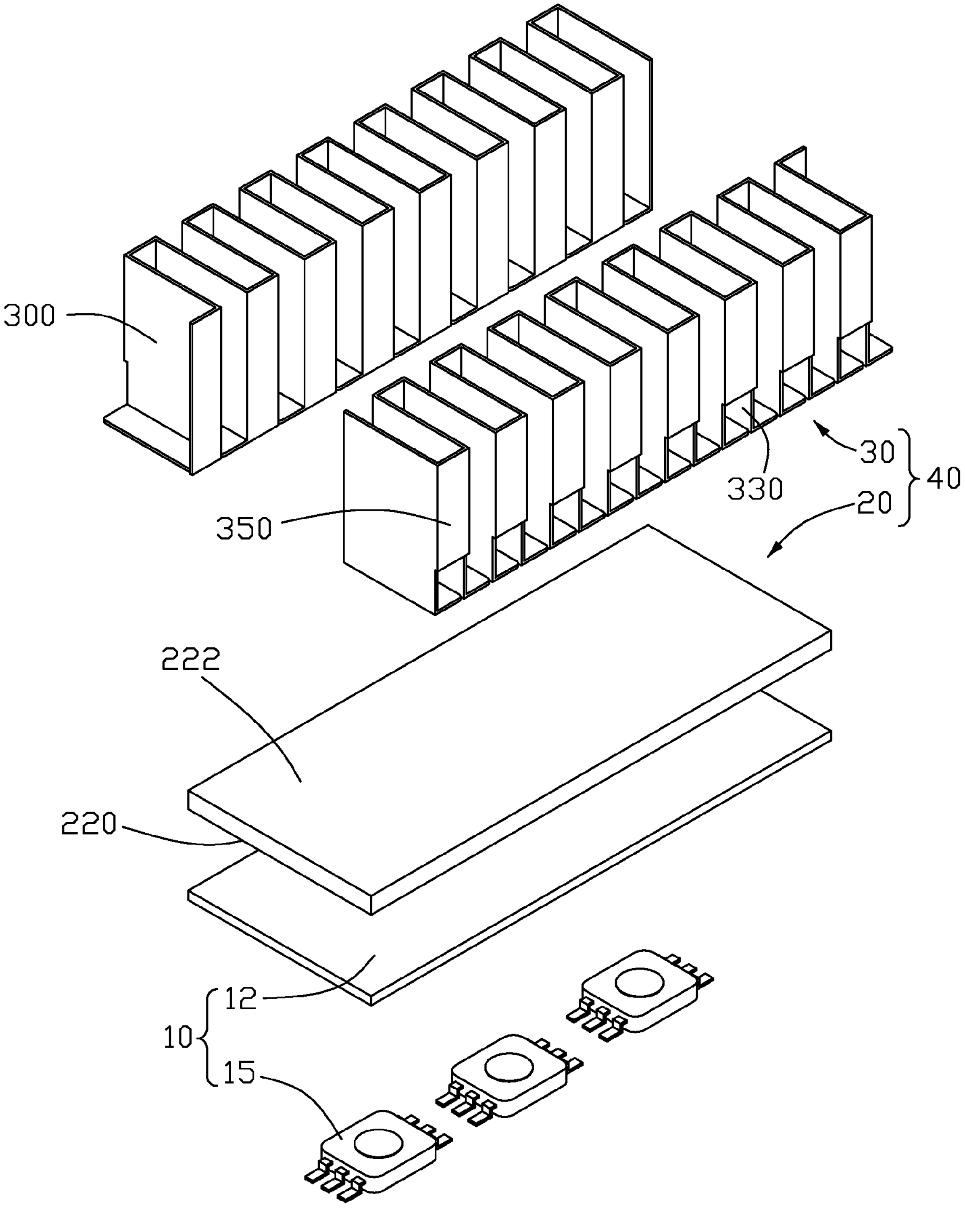
FIG. 1 is an exploded, isometric view of an LED device including a heat dissipation device and LEDs in accordance with a preferred embodiment of the present invention.

Referring to FIG. 1, an LED device in accordance with a preferred embodiment of the present invention adapted for a lighting purpose is shown. The LED device comprises an LED module 10 used for emitting light, a heat dissipation device 40 for dissipating heat generated by the LED module 10. The LED module 10 comprises a rectangular circuit board 12 and a plurality of LEDs 15. The LEDs 15 are evenly spaced and electrically mounted on a bottom surface (not labeled) of the circuit board 12. The heat dissipation device 40 comprises a heat spreader 20 and two heat sinks 30 mounted on the heat spreader 20.

The heat spreader 20 is rectangular and made of metal such as aluminum, copper or alloy thereof, which has a good thermal conductivity. The LED module 10 is attached to a bottom portion 220 of the heat spreader 20. The two heat sinks 30 are attached to a top portion 222 of the heat spreader 20.

Figure 2:
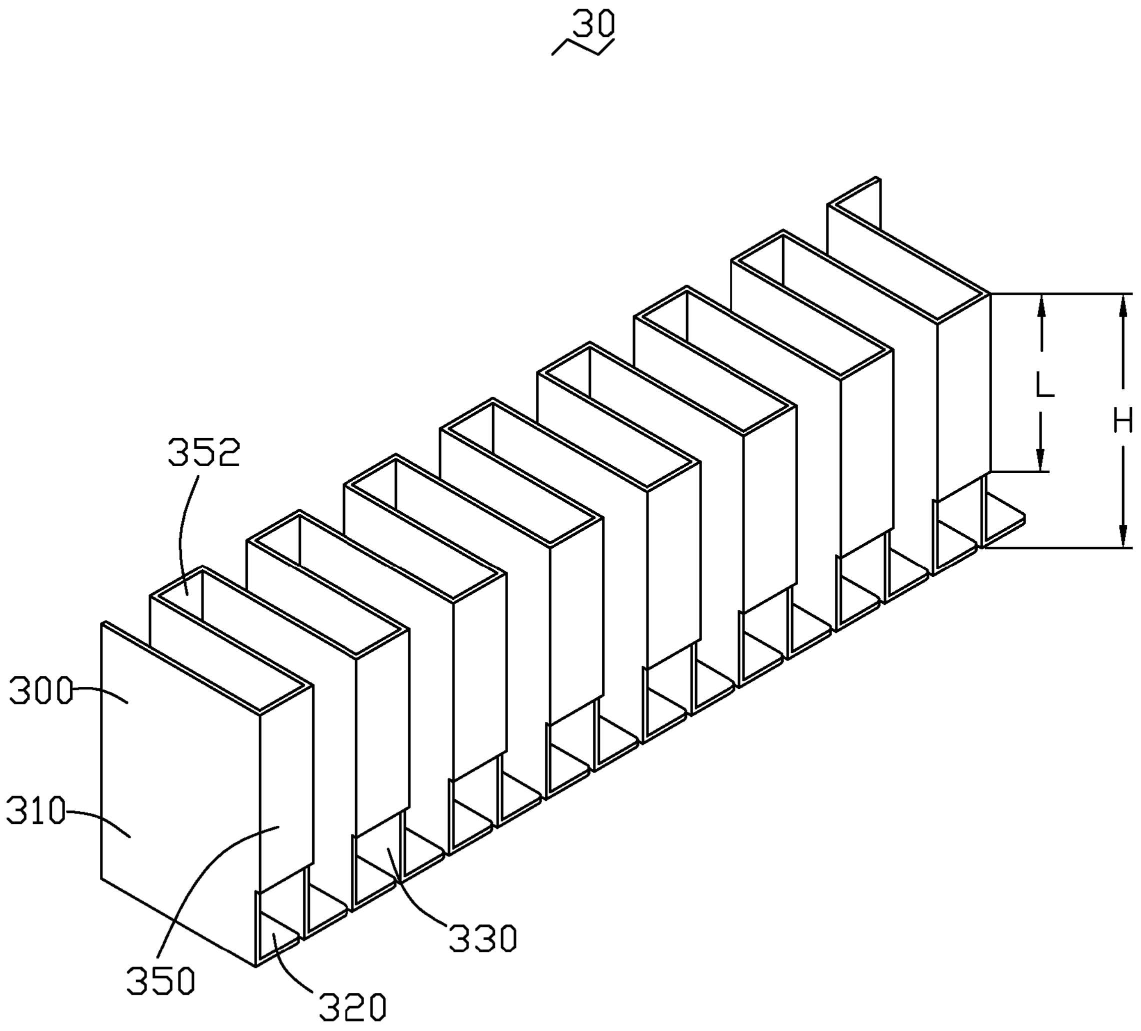
FIG. 2 is one of two heat sinks of the heat dissipation device in FIG. 1.

Referring to FIG. 2, each of the heat sinks 30 is formed by folding a metal sheet, such as an aluminum or a copper sheet. The heat sink 30 comprises a plurality of bended fins 300 stacked together. Each of the fins 300 is L-shaped and comprises a vertical long plate 310 and a horizontal short plate 320. The short plate 320 perpendicularly extends from a bottom edge of the long plate 310. The short plate 320 abuts against the bottom edge of the long plate 310 of an adjacent fin 300. A plurality of evenly spaced short walls 350 are formed at a lateral side of the heat sink 30 and a plurality of evenly spaced long walls 352 are formed at an opposite lateral side of the heat sink 30. The short walls 350 and the long walls 352 are arranged in an alternative fashion. Two adjacent fins 300 are connected with each other by the short walls 350 or the long walls 352 extending from side edges of the long plates 310. The short walls 350 are distributed on an upper portion of the lateral side of the heat sink 30. Each of the short walls 350 has a height L that is shorter than a height H of the long plate 310. A plurality of rectangular openings 330 are formed below the short walls 350 in the lateral side of the heat sink 30. Each of the openings 330 is enclosed by a bottom edge of a corresponding short wall 350, lower portions of side edges of two corresponding adjacent long plates 310 and a side edge of a corresponding short plate 320. Each of the long walls 352 has a same height with that of the long plate 310.

Figure 3:
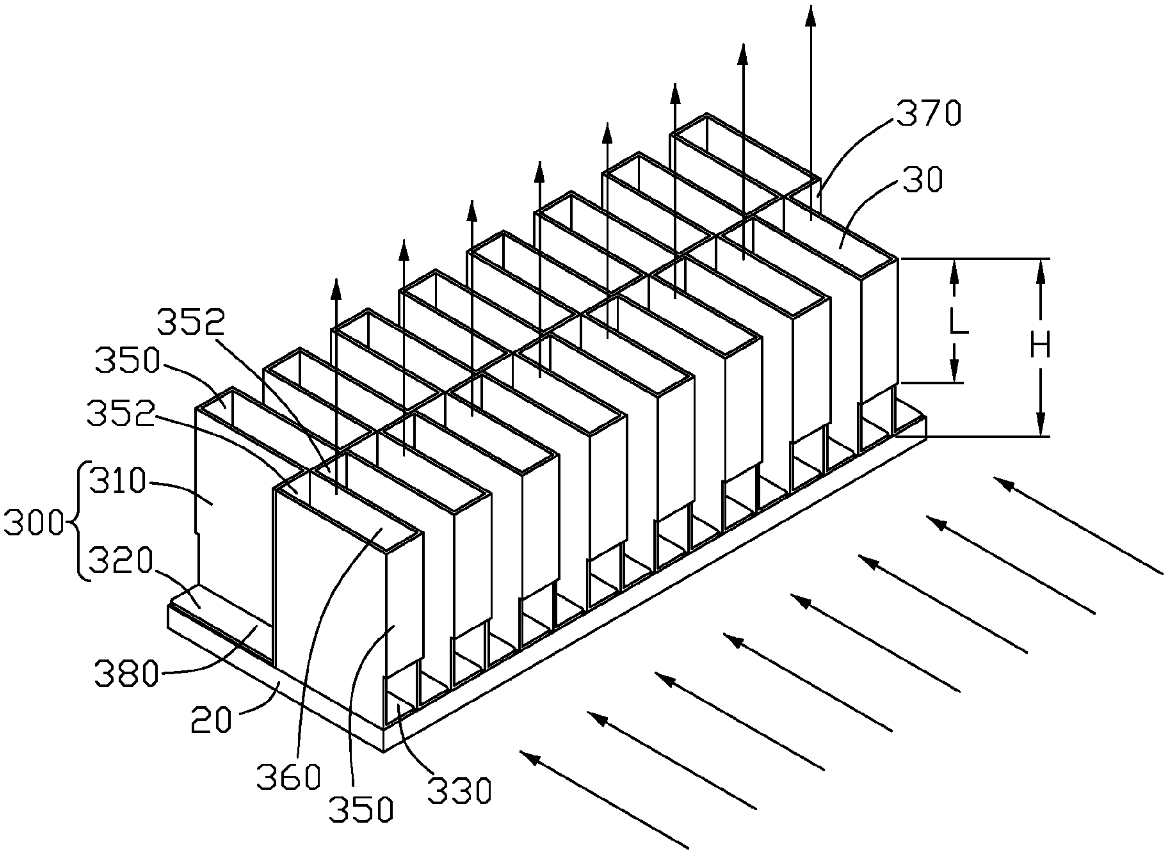
FIG. 3 is an assembled view of FIG. 1.

Referring to FIG. 3, the two heat sinks 30 are mounted to the heat spreader 20 and parallel to each other. The short walls 350 of the two heat sinks 30 are positioned distant from each other and located at two opposite lateral sides of the two heat sinks 30, while the long walls 352 are positioned close to each other. The short plates 320 of the two heat sinks 30 are attached to the top portion 222 of the heat spreader 20 by soldering. The long plates 310 of the heat sinks 30 are perpendicularly to the top portion 222 of the heat spreader 20. The long walls 352 of one of the two heat sinks 30 alternatively connect with the long walls 352 of the other one of the two heat sinks 30 so that a continuing wall 370 is formed by the long walls 352 at a middle of the two heat sinks 30. The short walls 350 of the one heat sink 30 are opposing to the long walls 352 of the other one of the heat sinks 30; thus, the short walls 350 cooperate with the long plates 310, the short plates 320 and the long walls 352 to enclose a plurality of cavities 360 each of which is communicated with a corresponding opening 330.

In use, heat generated by the LED module 10 is firstly absorbed by the heat spreader 20; then, the heat is conveyed to bottom portions 380 of the two heat sinks 30, which are constructed by the short plates 320 of the fins 300. Ambient airflow around the heat sinks 30 flow into the cavities 360 through the openings 330 and reach the bottom portions 380 of the two heat sinks 30 substantially where a large amount of heat accumulates. The airflow exchanges heat with the bottom portions 380 and becomes heated. The heated airflow floats upwardly and is guided to ambient above the two heat sinks 30 by the cavities 360. It is obvious that heat-dissipation efficiency of the two heat sinks 30 having the short walls 350 is enhanced, when compared with the one without the short walls 350. The heat sinks 30 enable more air to flow into the bottom portions 380 and substantially exchange heat with the fins 300; thus, the heat accumulating in the bottom portions 380 can be taken away to surrounding environment by the air more quickly and efficiently. The height L of the short wall 350 is determined by the height H of the heat sink 30 in order to optimize the heat dissipating efficiency of the heat dissipation device 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device adapted for use in dissipating heat generated by a plurality of LEDs mounted on a circuit board comprising:

a heat spreader adapted for thermally connecting with the printed circuit board; and two heat sinks mounted on the heat spreader, adapted for thermally connecting with the circuit board via the heat spreader, each of the two heat sinks comprising a plurality of bent fins connected together, wherein each fin defines a short wall formed at a lateral, outer side of the each fin, an opening below the short wall, and a cavity communicating with the opening, the opening being opened laterally outwardly and the cavity being extended along a direction perpendicular to the opened direction of the opening, whereby airflow can enter the cavity via the opening.

2. The heat dissipation device as claimed in claim 1, wherein each of the two heat sinks is formed by folding a metal sheet.

3. The heat dissipation device as claimed in claim 1, wherein the cavities in one of the heat sinks are alternated with the cavities in another one of the heat sinks.

4. The heat dissipation device as claimed in claim 3, wherein each of the fins of the two heat sinks comprises a vertical long plate and a horizontal short plate, and the short plates of the fins are attached to a top portion of the heat spreader.

5. The heat dissipation device as claimed in claim 4, wherein the short walls are evenly spaced from each other, each short wall connecting edges of the long plates of two adjacent fins.

6. The heat dissipation device as claimed in claim 5, wherein a plurality of evenly spaced long walls having a same height with that of the long plates are formed at a lateral side of each of the two the heat sinks, the long walls of the one of the two heat sinks being opposite to the short walls of the another one of the two heat sinks.

7. The heat dissipation device as claimed in claim 6, wherein the two heat sinks are so positioned that the long walls of the two heat sinks connect with each other, the long walls of the one of the two heat sinks alternating with the long walls of the another one of the two heat sinks, whereby the long walls are located at a middle of the two heat sinks.

8. The heat dissipation device as claimed in claim 7, wherein the short walls of the two heat sinks are positioned at two opposite lateral sides thereof, the short walls cooperating with the long plates, the short plates and the long walls to enclose the plurality of cavities, respectively.

9. The heat dissipation device as claimed in claim 4, wherein each of the short walls has a height that is shorter than a height of the long plate of each of the fins.

10. A heat dissipation device used for dissipating heat generated by a plurality of LEDs mounted on a circuit board comprising:

a heat spreader adapted for being mounted on the circuit board for absorbing heat from the LEDs;

two folded fins connected together, comprising a plurality of spaced openings at two laterally opposite sides of the two folded fins and a plurality of cavities communicating with the openings, respectively, wherein the cavities in one of the folded fins are alternated with the cavities in another one of the folded fins, the openings being located near the heat spreader and opened to a orientation which is perpendicular to an extending direction of a corresponding cavity.

11. The heat dissipation device as claimed in claim 10, wherein the heat spreader is made of a metal plate.

12. The heat dissipation device as claimed in claim 11, wherein each of the folded fins comprises a vertical long plate and a horizontal short plate, and the short plates of the fins are attached to a top portion of the heat spreader.

13. The heat dissipation device as claimed in claim 12, wherein each of the folded fins has short wall above a corresponding opening, and the short wall has a height which is shorter than that of the long plate of each of the fins.

14. The heat dissipation device as claimed in claim 10, wherein a continuing wall is formed at a middle of the two folded fins by connecting a plurality of first long walls of one of the folded fins and a plurality of second long walls of the another one of the folded fins together, the first long walls and the second long walls being alternated with each other.

15. An electronic assembly comprising:

a printed circuit board having two opposite first and second faces;

a plurality of LEDs mounted on the first face of the printed circuit board;

a heat spreader made of a metallic plate being mounted on the second face of the printed circuit board; and a heat sink mounted on the heat spreader, defining a plurality of openings near the heat spreader and oriented laterally, and a plurality cavities communicating with the openings, respectively, and oriented vertically.

16. The electronic assembly as claimed in claim 15, wherein the heat sink comprises first and second folded fins arranged on the heat spreader, the folded fins being parallel to each other and the cavities being divided into first and second groups respectively formed by the first and second fins, the cavities of the first group being alternated with the cavities of the second group.

17. The electronic assembly as claimed in claimed 16, wherein the folded fins comprise a plurality of bottom plates soldered to the heat spreader, a side edge of each of the bottom plates defining a side of a corresponding opening.

* * * * *